United States Patent
Park et al.

(10) Patent No.: US 12,407,338 B2
(45) Date of Patent: Sep. 2, 2025

(54) FREQUENCY MULTIPLIER CIRCUITS HAVING CROSS-COUPLED CAPACITORS THEREIN WHICH SUPPORT FREQUENCY MULTIPLICATION

(71) Applicant: SAMSUNG ELECTRONICS CO., LTD., Suwon-si (KR)

(72) Inventors: Seongsoo Park, Suwon-si (KR); Taewook Kim, Seoul (KR); Hyunwoong Lim, Seoul (KR); Taewan Kim, Suwon-si (KR); Hyungyu Kim, Suwon-si (KR); Jooik Chung, Suwon-si (KR); Michael Choi, Suwon-si (KR)

(73) Assignees: Samsung Electronics Co., Ltd. (KR); Industry-Academic Cooperation Foundation, Yonsei University (KR)

( * ) Notice: Subject to any disclaimer, the term of this patent is extended or adjusted under 35 U.S.C. 154(b) by 13 days.

(21) Appl. No.: 18/303,502

(22) Filed: Apr. 19, 2023

(65) Prior Publication Data
US 2024/0007090 A1    Jan. 4, 2024

(30) Foreign Application Priority Data

May 20, 2022  (KR) .................. 10-2022-0062315
Sep. 2, 2022   (KR) .................. 10-2022-0111676

(51) Int. Cl.
  *H03K 5/00*   (2006.01)
  *H03K 17/687*  (2006.01)

(52) U.S. Cl.
  CPC ..... *H03K 5/00006* (2013.01); *H03K 17/6874* (2013.01)

(58) Field of Classification Search
  CPC .............. H03K 17/6874; H03K 5/00006
  USPC ................. 327/116, 119, 120–122
  See application file for complete search history.

(56) References Cited

U.S. PATENT DOCUMENTS

| 8,040,166 B2 | 10/2011 | Bao |
| 8,237,472 B2 | 8/2012 | Kuo et al. |
| 8,410,830 B2 * | 4/2013 | Mahdavi .......... H03B 5/1215 327/120 |

(Continued)

FOREIGN PATENT DOCUMENTS

| CN | 103731103 B | 8/2016 |
| KR | 102088668 B1 | 3/2020 |

(Continued)

*Primary Examiner* — Menatoallah Youssef
*Assistant Examiner* — Colleen J O Toole
(74) *Attorney, Agent, or Firm* — Myers Bigel, P.A.

(57) ABSTRACT

A frequency multiplier includes a capacitor circuit having a plurality of capacitors therein, and is responsive to a differential input signal applied to an inverting input node and a non-inverting input node thereof. A frequency multiplication circuit (FMC) is provided, which has a plurality of transistors therein. The FMC is configured to receive components of the differential input signal passing through the plurality of capacitors, and multiply a frequency of the components of the differential input signal. A plurality of inductor loads are provided, which are connected to an inverting output node and a non-inverting output node of the FMC, and are configured to convert a current signal generated by the FMC into a voltage signal.

18 Claims, 13 Drawing Sheets

(56) References Cited

U.S. PATENT DOCUMENTS 8,629,708 B2     1/2014  Ben-Yishay et al.
9,369,091 B2 *   6/2016  Horng ..................... H03F 3/193

FOREIGN PATENT DOCUMENTS

KR          102198548  B1     1/2021
KR          102331883  B1    11/2021

* cited by examiner

FREQUENCY MULTIPLIER CIRCUITS HAVING CROSS-COUPLED CAPACITORS THEREIN WHICH SUPPORT FREQUENCY MULTIPLICATION

REFERENCE TO PRIORITY APPLICATIONS

This application claims priority under 35 U.S.C. § 119 to Korean Patent Application Nos. 10-2022-0062315 and 10-2022-0111676, filed May 20, 2022 and Sep. 2, 2022, respectively, in the Korean Intellectual Property Office, the disclosures of which are hereby incorporated herein by reference.

BACKGROUND

The inventive concept relates to integrated circuit devices and, more particularly, to frequency multiplier circuits.

Recently, as the level of demand for high integration, downsizing, and high performance for smartphones and various other types of high-tech electronic devices increases, the significance of a system on chip (SoC) field has increased. Electronic devices may need to use signals having various frequencies in systems to meet the increased integration levels, and still provide high performance. However, it is often difficult to mount, in electronic devices, multiple frequency generators, which support the many signals having different frequencies. Therefore, there is a need for a frequency multiplier that enables a small number of frequency generators to generate various frequencies, including generating a millimeter wave (mm-wave) signal by multiplying a relatively low frequency signal.

SUMMARY

The inventive concept may provide a frequency multiplier having cross-coupled capacitors therein, which support high conversion gain.

According to an aspect of the inventive concept, there is provided a frequency multiplier including: (i) a first transistor having a drain connected to a non-inverting output node, (ii) a second transistor having a drain connected to the drain of the first transistor and the non-inverting output node, (iii) a third transistor having a drain connected to an inverting output node, and a source connected to a source of the first transistor, (iv) a fourth transistor having a drain connected to the drain of the third transistor and the inverting output node, and a source connected to a source of the second transistor, (v) a first capacitor connected between a gate of the first transistor and an inverting input node, (vi) a second capacitor connected between a gate of the second transistor and a non-inverting input node, (vii) a third capacitor connected between a gate of the third transistor and the inverting input node, (viii) and a fourth capacitor connected between a gate of the fourth transistor and the non-inverting input node.

According to another aspect of the inventive concept, there is provided a frequency multiplier including a capacitor circuit having a plurality of capacitors therein, which are configured to receive a differential input signal, and a frequency multiplication circuit having a first transistor, a second transistor, a third transistor, and a fourth transistor therein. This frequency multiplication circuit is configured to multiply a frequency of a signal received from the capacitor circuit, and at least some of the plurality of capacitors are connected to corresponding gates of the first to fourth transistors.

According to another aspect of the inventive concept, there is provided a frequency multiplier having a capacitor circuit therein, which includes a plurality of capacitors connected to an inverting input node or a non-inverting input node, and a frequency multiplication circuit (FMC). The FMC may include a plurality of transistors, which are collectively configured to receive an input signal through the plurality of capacitors, and multiply a frequency of the input signal. A plurality of inductor loads are also provided. These loads, which convert a current signal to a voltage signal, are connected to a corresponding inverting output node and a non-inverting output node.

According to a further aspect of the inventive concept, a frequency multiplier is provided, which includes: (i) a first totem pole arrangement of a first NMOS transistor and a first PMOS transistor having source terminals electrically connected together at a first source node, (ii) a second totem pole arrangement of a second NMOS transistor and a second PMOS transistor having source terminals electrically connected together at a second source node, (iii) a first input terminal capacitively coupled to the first source node, (iv) a second input terminal capacitively coupled to the second source node, (v) a first load having a net inductive reactance, electrically connected to drain terminals of the first and second NMOS transistors, and (vi) a second load having a net inductive reactance, electrically connected to drain terminals of the first and second PMOS transistors. The first and second input terminals of the frequency multiplier may be responsive to true and complementary signals of a differential input signal.

The frequency multiplier may also include (i) a first capacitor having a first terminal electrically coupled to the second input terminal and a second terminal electrically connected to a gate terminal of the first NMOS transistor, (ii) a second capacitor having a first terminal electrically coupled to the first input terminal and a second terminal electrically connected to a gate terminal of the second NMOS transistor, (iii) a third capacitor having a first terminal electrically coupled to the second input terminal and a second terminal electrically connected to a gate terminal of the first PMOS transistor, (iv) a fourth capacitor having a first terminal electrically coupled to the first input terminal and a second terminal electrically connected to a gate terminal of the second PMOS transistor, (v) a fifth capacitor having a first terminal electrically coupled to a first input terminal of the frequency multiplier and a second terminal electrically connected to the first source node, and (vi) a sixth capacitor having a first terminal electrically coupled to a second input terminal of the frequency multiplier and a second terminal electrically connected to the second source node. In some embodiments of the inventive concept, the first, second, third and fourth capacitors may have an equivalent capacitance, and the fifth and sixth capacitors may have an equivalent capacitance, which is greater than a capacitance of the first, second, third and fourth capacitors. In further embodiments, the first capacitor may have a capacitance that is at least ten (10) times greater than a gate-to-source capacitance of the first NMOS transistor.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings.

Figure 1:
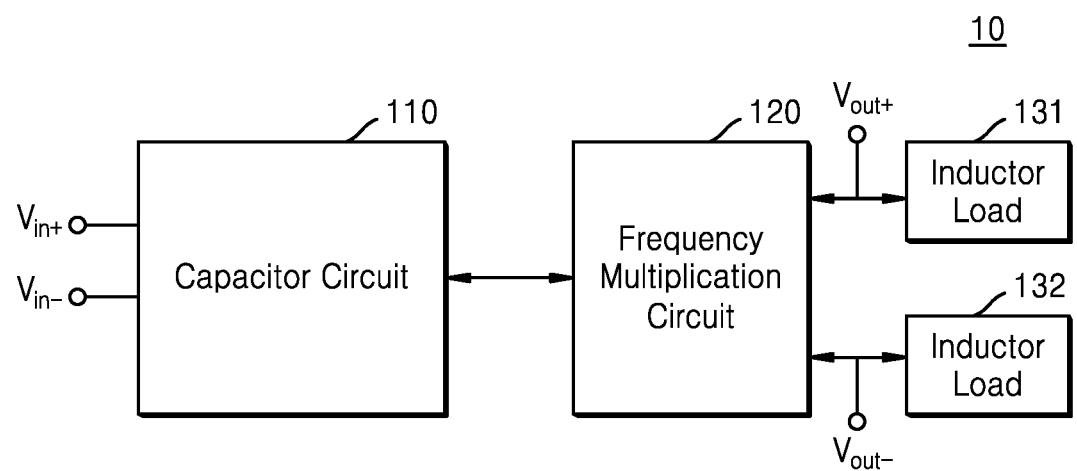
FIG. 1 is a block diagram illustrating a frequency multiplier according to an embodiment.

FIG. 1 is a block diagram illustrating a frequency multiplier according to an embodiment. In general, an oscillator, which generates a frequency signal in a millimeter wave (mm-wave) band, may not be easily designed due to high phase noise, large signal loss associated with signal distribution, and the like. Therefore, even when the oscillator outputs a signal having a relatively low frequency, a frequency multiplier for multiplying a frequency may be needed to generate a signal having a high frequency.

Referring to FIG. 1, a frequency multiplier 10 according to an embodiment may include a capacitor circuit 110, a frequency multiplication circuit 120, and/or inductor loads 131 and 132. The capacitor circuit 110 may be a circuit configured to receive a differential input signal. In detail, the capacitor circuit 110 may be connected to a non-inverting input node and an inverting input node, and may include a plurality of capacitors.

The frequency multiplication circuit 120 may be a circuit configured to multiply a frequency of a signal received from the capacitor circuit 110. The frequency multiplication circuit 120 may be connected to the capacitor circuit 110, and may include a plurality of transistors. The transistors included in the frequency multiplication circuit 120 may receive a differential input signal from the capacitors included in the capacitor circuit 110.

The inductor loads 131 and 132 may be circuits for converting a current signal having a multiplied frequency into a voltage signal. The inductor loads 131 and 132 may be connected to the frequency multiplication circuit 120. As shown, the inductor load 131 may be connected to a non-inverting output node (Vout+), and the inductor load 132 may be connected to an inverting output node (Vout−). Details of a detailed circuit configuration of the frequency multiplier 10 will be described more fully hereinbelow.

Figure 2:
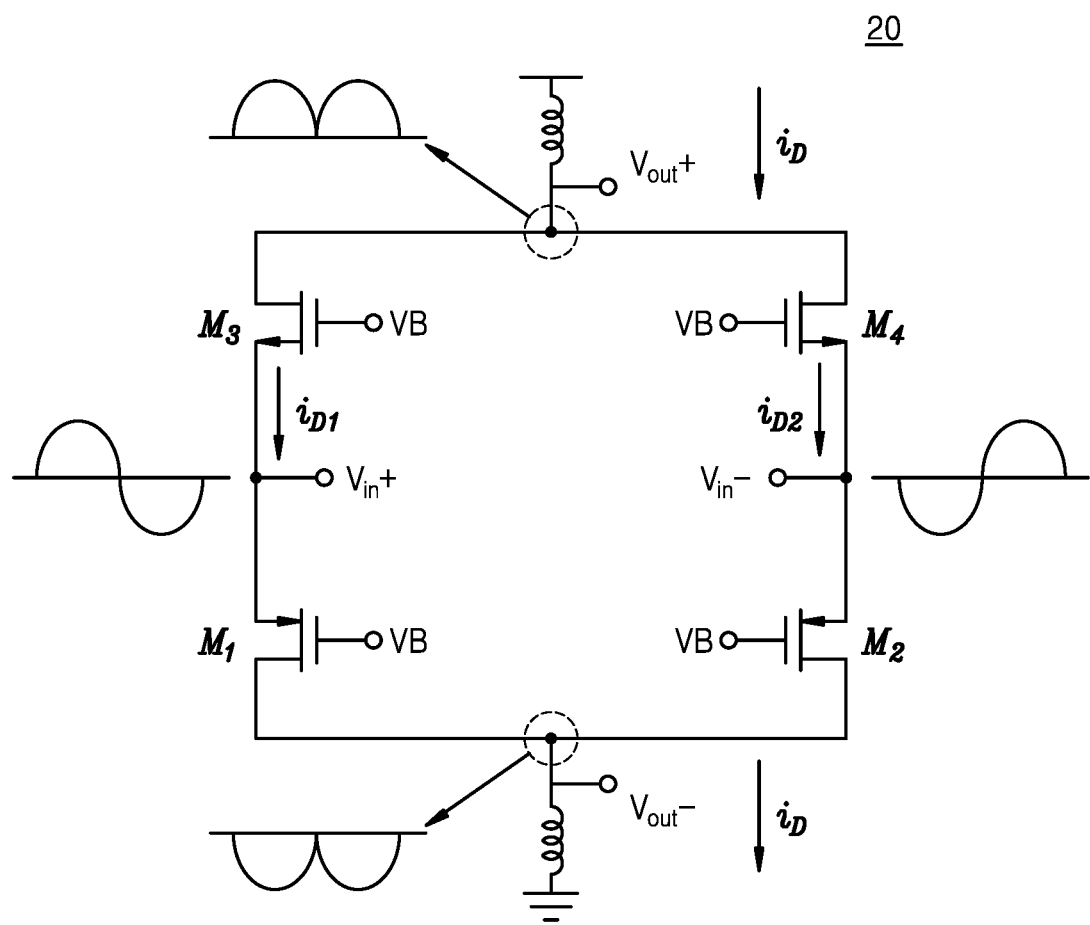
FIG. 2 is a circuit diagram of an example frequency multiplier.

FIG. 2 is a circuit diagram of an example of a frequency multiplier, which may be described with reference to FIG. 1. Referring to FIG. 2, a frequency multiplier 20 may include P-channel metal-oxide semiconductor (PMOS) transistors $M_1$ and $M_2$ and N-channel metal-oxide semiconductor (NMOS) transistors $M_3$ and $M_4$. The PMOS transistors $M_1$ and $M_2$, and the NMOS transistors $M_3$ and $M_4$ may be applied with a gate voltage VB via gates thereof, and may be applied with a non-inverted input voltage $V_{IN+}$ and an inverted input voltage $V_{IN-}$ via sources/drains thereof. The PMOS transistor $M_1$ and the PMOS transistor $M_2$ make a pair and the NMOS transistor $M_3$ and the NMOS transistor $M_4$ make a pair, and thus, the PMOS transistors $M_1$ and $M_2$, and the NMOS transistors $M_3$ and $M_4$ may operate as switches. For example, during a first half cycle of an input signal having a sine wave shape, the PMOS transistor $M_1$ and the NMOS transistor $M_4$ may be turned on, and the PMOS transistor $M_2$ and the NMOS transistor $M_3$ may be turned off, whereas during a second half cycle of the input signal, the opposite operation may be performed. In detail, when an input signal is $v_{in+}=\cos(w_0 t)$ and an inverted input signal is $v_{in-}=\cos(w_0 t-\pi)$, $i_{D1}=A(-v_{in+}-V_{th})^2$ and $i_{D2}=A(-v_{in-}-V_{th})^2$. Accordingly, a current $i_D$ of an output signal may be calculated as follows:

$$i_D = i_{D1} + i_{D2} = A\{(v_{in+} + V_{th})^2 + (v_{in+} - V_{th})^2\} =$$
$$2A(v_{in+}^2 + V_{th}^2) = 2A\{\cos^2(w_o t) + V_{th}^2\} = 2A\{1 + 2\cos(2w_o t) + V_{th}^2\}$$

As shown by these expressions, a frequency of the output signal may be two times (i.e., 2 $w_0$) a frequency $w_0$ of an input signal. From among harmonics generated from the frequency of the input signal, a frequency to be multiplied may be selected by the frequency multiplier 20. In addition, an intensity of a multiplied frequency signal may be smaller than an intensity of the input signal (i.e., a loss of a signal may occur).

In contrast, the frequency multiplier 10 of FIG. 1 according to an embodiment may include cross-coupled capacitors connected to a frequency multiplication circuit, and thus may increase a magnitude and effective transconductance of an effective input signal without additional current consumption, and may have a higher frequency conversion gain with low power, thereby minimizing a loss in an intensity of an output signal. In detail, the frequency multiplier 10 may have a high frequency conversion gain by including capacitors connected to transistors. For example, each of the capacitors respectively connected between gates of a plurality of transistors and a non-inverting input node or an inverting input node may be referred to as a cross-coupled capacitor. The cross-coupled capacitors may be included in the capacitor circuit 110. More details regarding cross-coupling of transistors and capacitors will be described later.

Figure 3A:
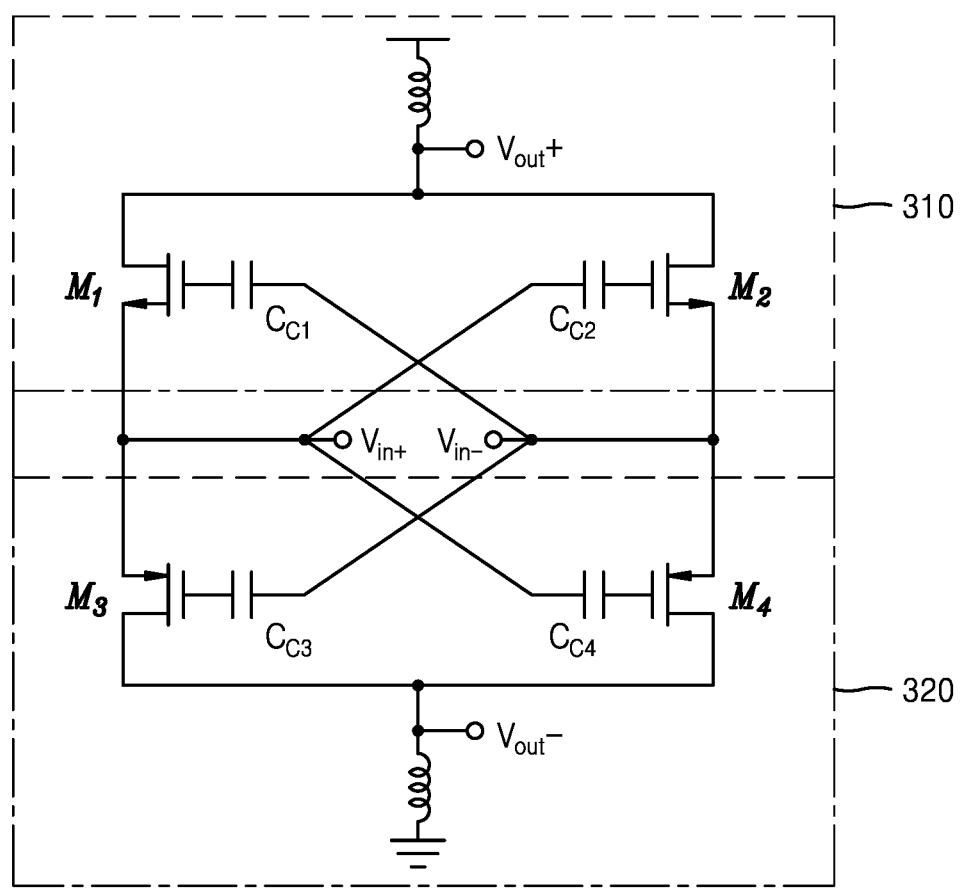
FIG. 3A is a diagram illustrating a circuit of a frequency multiplier, according to an embodiment.

FIG. 3A is a diagram illustrating a circuit of a frequency multiplier, according to an embodiment. Referring to FIG. 3A, a frequency multiplier 30 according to an embodiment may include a first transistor $M_1$, a second transistor $M_2$, a third transistor $M_3$, a fourth transistor $M_4$, a first capacitor $C_{C1}$, a second capacitor $C_{C2}$, and a third capacitor $C_{C3}$, and/or a fourth capacitor $C_{C4}$, connected as illustrated.

The first capacitor $C_{C1}$ may be connected between a gate of the first transistor $M_1$ and an inverting input node. The second capacitor $C_{C2}$ may be connected between a gate of the second transistor $M_2$ and a non-inverting input node. The third capacitor $C_{C3}$ may be connected between a gate of the third transistor $M_3$ and the inverting input node. The fourth capacitor $C_{C4}$ may be connected between a gate of the fourth transistor $M_4$ and the non-inverting input node.

A drain of the first transistor $M_1$, a drain of the second transistor $M_2$, and a non-inverting output node may be connected to one another, a drain of the third transistor $M_3$, a drain of the fourth transistor $M_4$, and an inverting output node may be connected to one another, and a source of the first transistor $M_1$ and a source of the third transistor $M_3$ may be connected to each other, and a source of the second transistor $M_2$ and a source of the fourth transistor $M_4$ may be connected to each other. Each of the first transistor $M_1$ and the second transistor $M_2$ may be an NMOS transistor. In addition, each of the third transistor $M_3$ and the fourth transistor $M_4$ may be a PMOS transistor.

The first capacitor $C_{C1}$, the second capacitor $C_{C2}$, the third capacitor $C_{C3}$, and the fourth capacitor $C_{C4}$ may have the same capacitance. In addition, the first transistor $M_1$, the second transistor $M_2$, the third transistor $M_3$, and the fourth transistor $M_4$ may have the same gate-source capacitance. Gate-source capacitors connected to a plurality of transistors are illustrated in more detail in FIGS. 3B and 3C to be described later.

In addition, each of the first capacitor $C_{C1}$, the second capacitor $C_{C2}$, the third capacitor $C_{C3}$, and the fourth capacitor $C_{C4}$ may have a capacitance that is sufficiently greater than a gate-source capacitance of each of the first transistor $M_1$, the second transistor $M_2$, the third transistor $M_3$, and the fourth transistor $M_4$. For example, each of the first capacitor $C_{C1}$, the second capacitor $C_{C2}$, the third capacitor $C_{C3}$, and the fourth capacitor $C_{C4}$ may have a capacitance that is at least ten (10) times a gate-source capacitance of each of the first transistor $M_1$, the second transistor $M_2$, the third transistor $M_3$, and the fourth transistor $M_4$, but is not limited thereto.

Figure 3B:
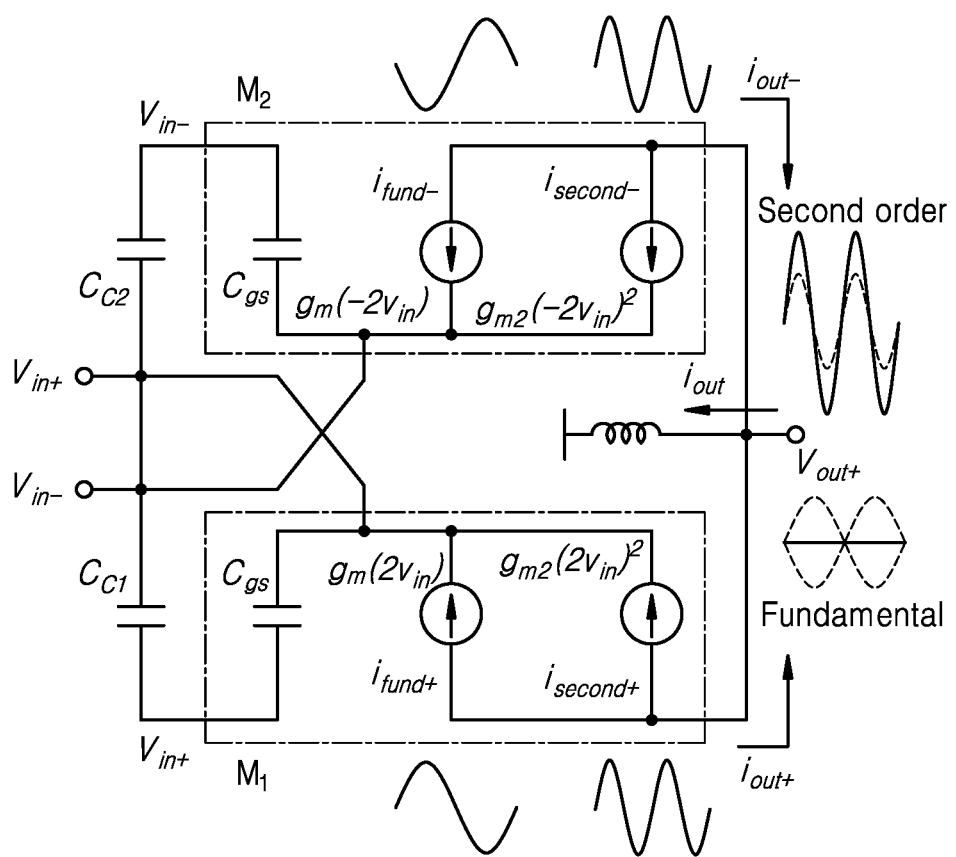
FIG. 3B is a diagram illustrating an equivalent circuit of a portion of a frequency multiplier, according to an embodiment.

FIG. 3B is a diagram illustrating an equivalent circuit of a portion of a frequency multiplier, according to an embodiment. Hereinafter, FIG. 3B will be described with reference to FIG. 3A. In particular, FIG. 3B is a diagram illustrating an equivalent circuit of a portion 310 including a first transistor $M_1$ and a second transistor $M_2$ in the frequency multiplier 30 of FIG. 3A. In detail, FIG. 3B may be a small signal equivalent model of the portion 310 of FIG. 3A. Referring to FIG. 3B, the first transistor $M_1$ may be represented by an equivalent circuit including a gate-source capacitor $C_{gs}$ and current sources of the first transistor $M_1$, and the second transistor $M_2$ may be represented by an equivalent circuit including a gate-source capacitor $C_{gs}$ and current sources of the second transistor $M_2$.

In the first transistor $M_1$, a current by a fundamental frequency component may be referred to as $i_{fund+}$, a current by a second-order frequency component may be referred to as $i_{second+}$, and in the second transistor $M_2$, a current by a fundamental frequency component may be referred to as $i_{fund-}$, and a current by a second-order frequency component may be referred to as $i_{second-}$. Here, when a capacitance of each of a first capacitor $C_{C1}$ and a second capacitor $C_{C2}$ is sufficiently greater than a capacitance of the gate-source capacitors $C_{gs}$ (capacitance of each of $C_{C1}$ and $C_{C2}$»capacitance of $C_{gs}$) (e.g., the first capacitor $C_{C1}$ may have a capacitance that is greater than or equal to 10 times a capacitance of the gate-source capacitor $C_{gs}$ of the first transistor $M_1$, but is not limited thereto). A conversion gain (CG) of the frequency multiplier 30 according to an embodiment may be calculated as follows.

$i_{fund+} = g_m(2V_{in+})$, $i_{second+} = g_{m2}(2V_{in+})^2$, $i_{fund-} = g_m(2V_{in-})$, $i_{second-} = g_{m2}(2V_{in-})^2$, $V_{in+} = V_A \cos(\omega t)$, $V_{in-} = -V_A \cos(\omega t)$, $i_{out+} = i_{fund+} + i_{second+} = 2\alpha V_A g_m \cos(\omega t) + g_{m2}\{2\alpha V_A \cos(\omega t)\}^2$ $i_{out-} = i_{fund-} + i_{second-} = 2\alpha V_A g_m \cos(\omega t) + g_{m2}\{2\alpha V_A \cos(\omega t)\}^2$ $i_{out} = i_{out+} + i_{out-} = 8\alpha 2 V_A 2 g_{m2}[\tfrac{1}{2}\{1+\cos(2\omega t)\}]$ $V_{out+} = 4\alpha^2 V_A^2 g_{m2} Z_L \cos(2\omega t)$ $CG = 4\alpha^2 V_A g_{m2} Z_L$ Here, $V_A$ may denote a magnitude of an input signal, and $Z_L$ may denote an impedance of an inductor load.

In contrast, a conversion gain $CG_{woCC}$ calculated with respect to the frequency multiplier 20 of FIG. 2 by the same method as described above may be as follows.

$CG_{woCC} = \alpha^2 V_A g_{m2} Z_L$

As a result, a conversion gain of the frequency multiplier 30 according to an embodiment may be four times higher than that of the frequency multiplier 20. In addition, the frequency multiplier 30 does not need additional power consumption for obtaining a high conversion gain described above. The conversion gain of the frequency multiplier 30 is higher than the conversion gain of the frequency multiplier 20 because a magnitude of an effective input voltage is doubled by cross-coupled capacitors. In other words, the frequency multiplier 30 according to an embodiment may use cross-coupled capacitors to increase a magnitude of an effective input voltage, and increase an effective transconductance. In addition, the frequency multiplier 30 may have a higher conversion gain, compared to current consumption.

Figure 3C:
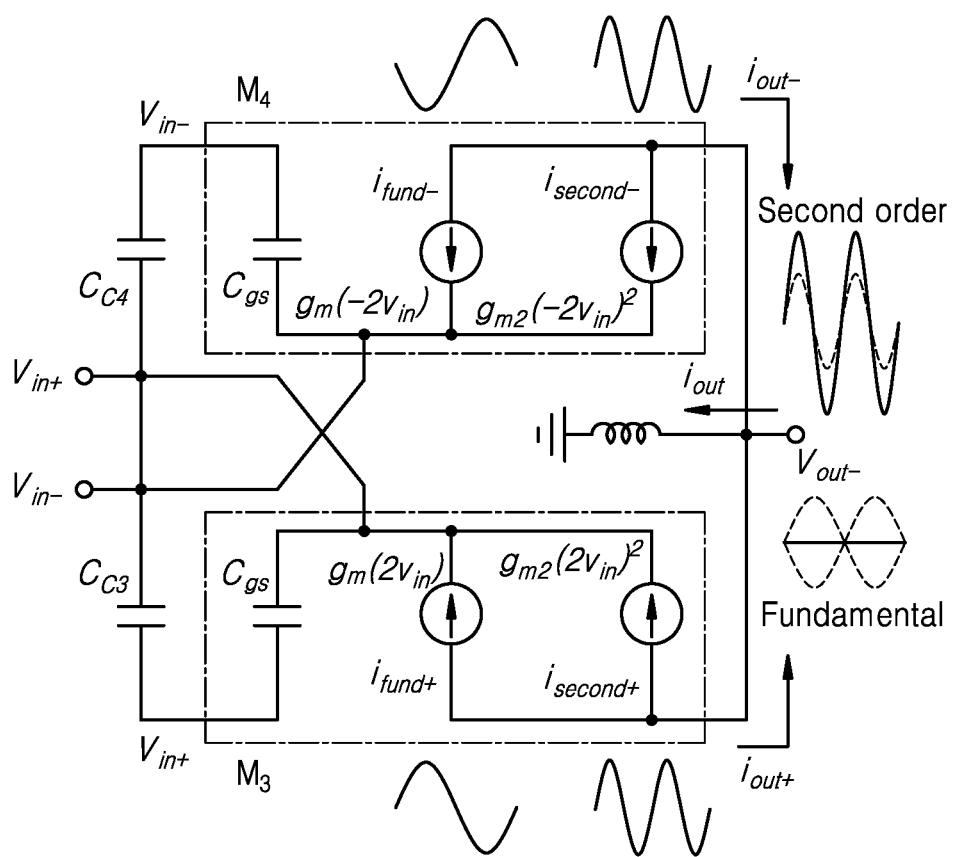
FIG. 3C is a diagram illustrating an equivalent circuit of a portion of a frequency multiplier, according to an embodiment.

FIG. 3C is a diagram illustrating an equivalent circuit of a portion 320 including a third transistor $M_3$ and a fourth transistor $M_4$ in the frequency multiplier 30 of FIG. 3A. In detail, FIG. 3C may be a small signal equivalent model of the portion 320 of FIG. 3A. Referring to FIG. 3C, the third transistor $M_3$ may be represented by an equivalent circuit including a gate-source capacitor $C_{gs}$ and current sources of the third transistor $M_3$, and the fourth transistor $M_4$ may be represented by an equivalent circuit including a gate-source capacitor $C_{gs}$ and current sources of the fourth transistor $M_4$.

Conversion gains of the third transistor $M_3$ and the fourth transistor $M_4$ may be calculated by the same method as the first transistor $M_1$ and the second transistor $M_2$ of FIG. 3B, and as a result, a conversion gain of the frequency multiplier 30 may be four times higher than that of the frequency multiplier 20. In addition, the frequency multiplier 30 does not need additional power consumption for obtaining a high conversion gain described above. The conversion gain of the frequency multiplier 30 is higher than the conversion gain of the frequency multiplier 20 because a magnitude of an effective input voltage is doubled by cross-coupled capacitors. In other words, the frequency multiplier 30 according to an embodiment may use cross-coupled capacitors to increase a magnitude of an effective input voltage, and increase an effective transconductance. In addition, the frequency multiplier 30 may have a high conversion gain, compared to current consumption.

Figure 4A:
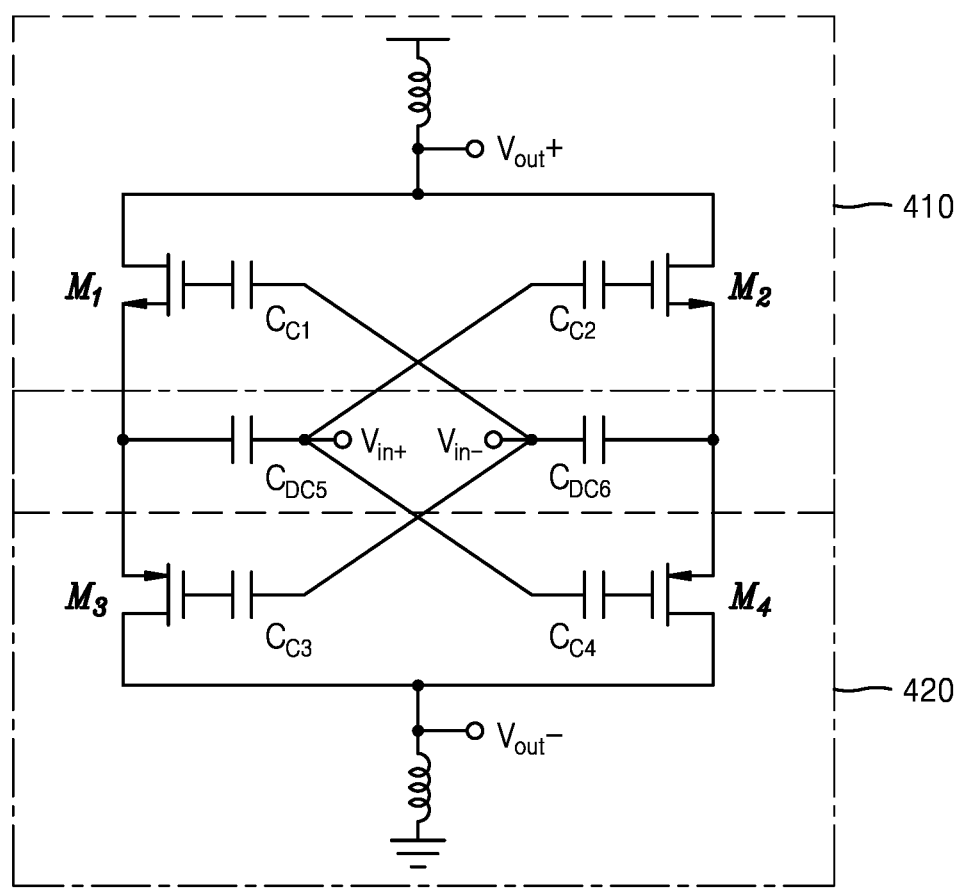
FIG. 4A is a diagram illustrating a circuit of a frequency multiplier, according to an embodiment.

FIG. 4A is a diagram illustrating a circuit of a frequency multiplier, according to an embodiment. Referring to FIG. 4A, a frequency multiplier 40 according to an embodiment may include a first transistor $M_1$, a second transistor $M_2$, a third transistor $M_3$, a fourth transistor $M_4$, a first capacitor $C_{C1}$, a second capacitor $C_{C2}$, a third capacitor $C_{C3}$, a fourth capacitor $C_{C4}$, a fifth capacitor $C_{DC5}$, and/or a sixth capacitor $C_{DC6}$.

The first capacitor $C_{C1}$ may be connected between a gate of the first transistor $M_1$ and an inverting input node. The second capacitor $C_{C2}$ may be connected between a gate of the second transistor $M_2$ and a non-inverting input node. The third capacitor $C_{C3}$ may be connected between a gate of the third transistor $M_3$ and the inverting input node. The fourth capacitor $C_{C4}$ may be connected between a gate of the fourth transistor $M_4$ and the non-inverting input node.

A drain of the first transistor $M_1$, a drain of the second transistor $M_2$, and a non-inverting output node may be connected to one another, a drain of the third transistor $M_3$, a drain of the fourth transistor $M_4$, and an inverting output node may be connected to one another, a source of the first transistor $M_1$ and a source of the third transistor $M_3$ may be connected to each other, and a source of the second transistor $M_2$ and a source of the fourth transistor $M_4$ may be connected to each other. Each of the first transistor $M_1$ and the second transistor $M_2$ may be an NMOS transistor. In addition, each of the third transistor $M_3$ and the fourth transistor $M_4$ may be a PMOS transistor.

The fifth capacitor $C_{DC5}$ may be connected between a first node between the source of the first transistor $M_1$ and the source of the third transistor $M_3$ and the non-inverting input node. The sixth capacitor $C_{DC6}$ may be connected between a second node between the source of the second transistor $M_2$ and the source of the fourth transistor $M_4$ and the inverting input node. Each of the fifth capacitor $C_{DC5}$ and the sixth capacitor $C_{DC6}$ is a capacitor connected between NMOS and PMOS transistors. A voltage having a DC component may be generated by a connection between NMOS and PMOS transistors, a voltage level of the DC component generated by the connection between the NMOS and the PMOS transistors may be different from a voltage level of a DC component of an input signal, and a current may be generated due to the difference between the voltage levels. Each of the fifth capacitor $C_{DC5}$ and the sixth capacitor $C_{DC6}$ may be a capacitor for preventing a current from being generated due to a difference between voltage levels as described above.

The first capacitor $C_{C1}$, the second capacitor $C_{C2}$, the third capacitor $C_{C3}$, and the fourth capacitor $C_{C4}$ may have the same capacitance. In addition, the fifth capacitor $C_{DC5}$ and the sixth capacitor $C_{DC6}$ may have the same capacitance. The first transistor $M_1$, the second transistor $M_2$, the third transistor $M_3$, and the fourth transistor $M_4$ may have the same gate-source capacitance.

In addition, each of the first capacitor $C_{C1}$, the second capacitor $C_{C2}$, the third capacitor $C_{C3}$, the fourth capacitor $C_{C4}$, the fifth capacitor $C_{DC5}$, and the sixth capacitor $C_{DC6}$ may have a capacitance that is sufficiently greater than a gate-source capacitance of each of the first transistor $M_1$, the second transistor $M_2$, the third transistor $M_3$, and the fourth transistor $M_4$. For example, each of the first capacitor $C_{C1}$, the second capacitor $C_{C2}$, the third capacitor $C_{C3}$, and the fourth capacitor $C_{C4}$ may have a capacitance that is greater than or equal to ten (10) times a gate-source capacitance of each of the first transistor $M_1$, the second transistor $M_2$, the third transistor $M_3$, and the fourth transistor $M_4$, but is not limited thereto. In addition, each of the fifth capacitor $C_{DC5}$ and the sixth capacitor $C_{DC6}$ may have a capacitance that is twice (2×) a capacitance of each of the first capacitor $C_{C1}$, the second capacitor $C_{C2}$, the third capacitor $C_{C3}$, and the fourth capacitor $C_{C4}$, but is not limited thereto.

Figure 4B:
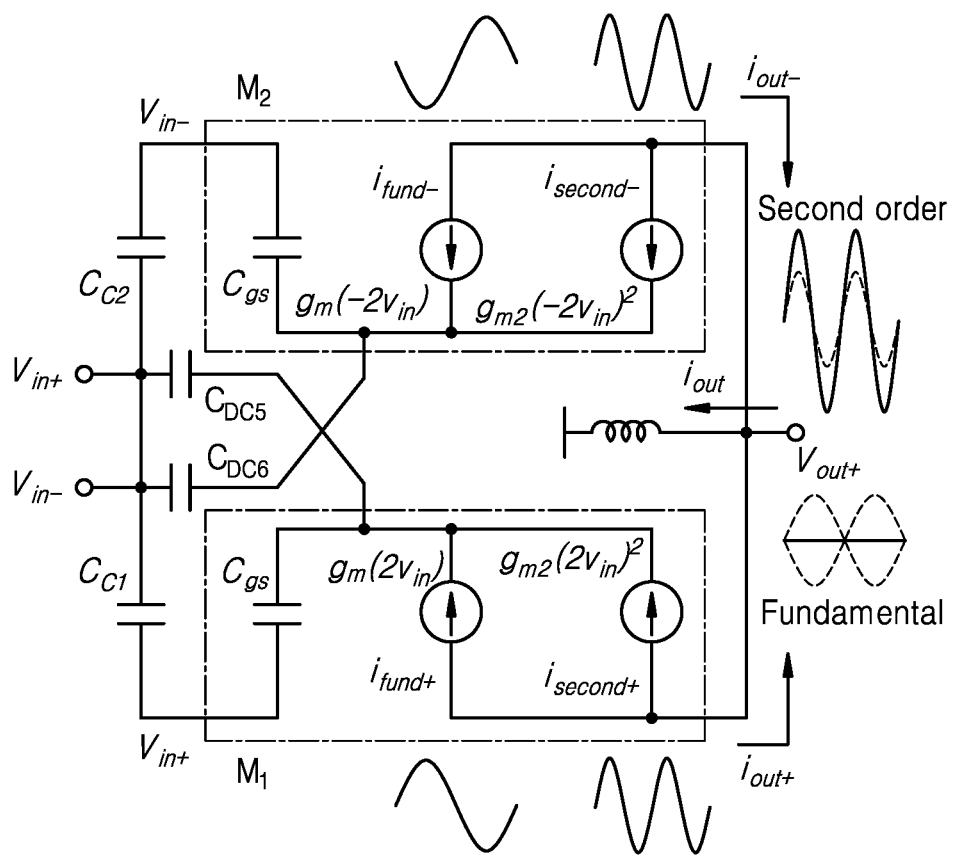
FIG. 4B is a diagram illustrating an equivalent circuit of a portion of a frequency multiplier, according to an embodiment.

FIG. 4B is a diagram illustrating an equivalent circuit of a portion 410 including a first transistor $M_1$ and a second transistor $M_2$ in the frequency multiplier 40 of FIG. 4A. In detail, FIG. 4B may be a small signal equivalent model of the portion 410 of FIG. 4A. Referring to FIG. 4B, the first transistor $M_1$ may be represented by an equivalent circuit including a gate-source capacitor $C_{gs}$ and current sources of the first transistor $M_1$, and the second transistor $M_2$ may be represented by an equivalent circuit including a gate-source capacitor $C_{gs}$ and current sources of the second transistor $M_2$.

Conversion gains of the first transistor $M_1$ and the second transistor $M_2$ may be calculated by the same method as the first transistor $M_1$ and the second transistor $M_2$ of FIG. 3B. Here, a capacitance of each of a fifth capacitor $C_{DC5}$ and a sixth capacitor $C_{DC6}$ needs to be sufficiently greater than a capacitance of a gate-source capacitor $C_{gs}$. For example, each of the fifth capacitor $C_{DC5}$ and the sixth capacitor $C_{DC6}$ may have a capacitance that is at least twenty (20) times a capacitance of the gate-source capacitor $C_{gs}$, but is not limited thereto. Accordingly, a conversion gain of the frequency multiplier 40 is four times higher than that of the frequency multiplier 20, and the frequency multiplier 40 does not need additional power consumption for obtaining a high conversion gain described above. The conversion gain of the frequency multiplier 40 is higher than the conversion gain of the frequency multiplier 20 because a magnitude of an effective input voltage is doubled by cross-coupled capacitors. In other words, the frequency multiplier 40 according to an embodiment may use cross-coupled capacitors to increase a magnitude of an effective input voltage, and increase an effective transconductance. In addition, the frequency multiplier 40 may have a high conversion gain, compared to current consumption.

Figure 4C:
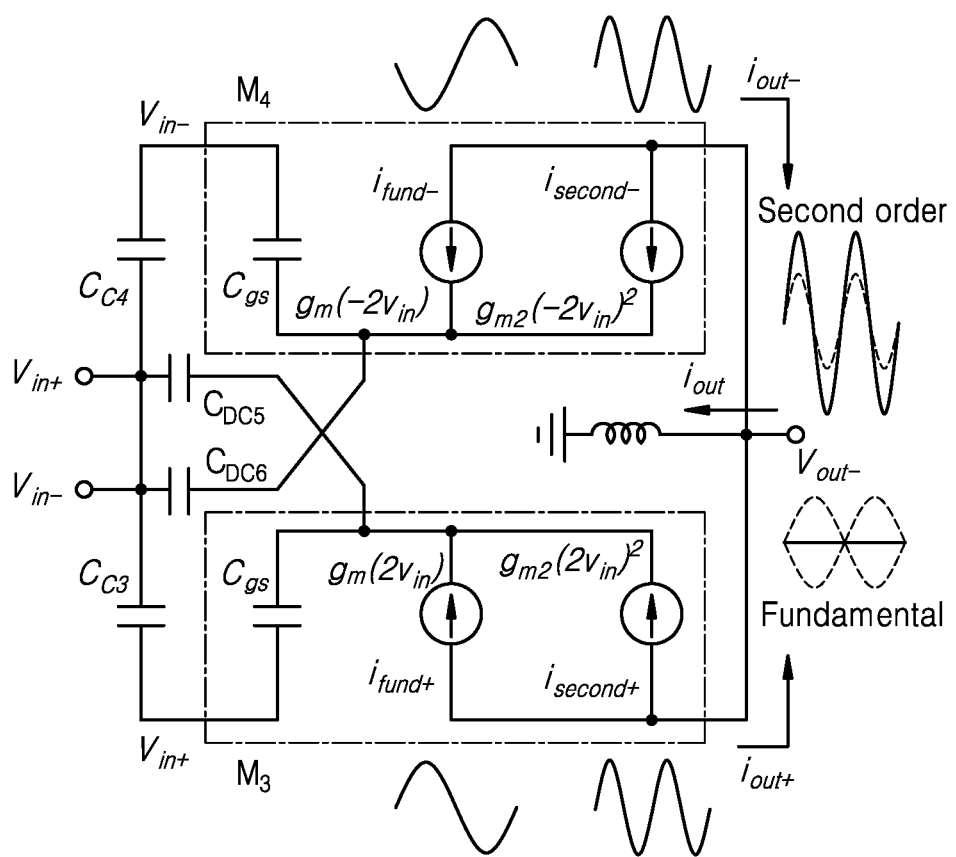
FIG. 4C is a diagram illustrating an equivalent circuit of a portion of a frequency multiplier, according to an embodiment.

FIG. 4C is a diagram illustrating an equivalent circuit of a portion of a frequency multiplier, according to an embodiment. Hereinafter, FIG. 4C will be described with reference to FIGS. 4A and 4B. FIG. 4C is a diagram illustrating an equivalent circuit of a portion 420 including a third transistor $M_3$ and a fourth transistor $M_4$ in the frequency multiplier 40 of FIG. 4A. In detail, FIG. 4C may be a small signal equivalent model of the portion 420 of FIG. 4A. Referring to FIG. 4C, the third transistor $M_3$ may be represented by an equivalent circuit including a gate-source capacitor $C_{gs}$ and current sources of the third transistor $M_3$, and the fourth transistor $M_4$ may be represented by an equivalent circuit including a gate-source capacitor $C_{gs}$ and current sources of the fourth transistor $M_4$.

Conversion gains of the third transistor $M_3$ and the fourth transistor $M_4$ may be calculated by the same method as the first transistor $M_1$ and the second transistor $M_2$ of FIG. 3B. Here, a capacitance of each of a fifth capacitor $C_{DC5}$ and a sixth capacitor $C_{DC6}$ needs to be sufficiently greater than a capacitance of a gate-source capacitor $C_{gs}$. For example, each of the fifth capacitor $C_{DC5}$ and the sixth capacitor $C_{DC6}$ may have a capacitance that is greater than or equal to 20 times a capacitance of the gate-source capacitor $C_{gs}$, but is not limited thereto. Accordingly, a conversion gain of the frequency multiplier 40 is four times higher than that of the frequency multiplier 20, and the frequency multiplier 40 does not need additional power consumption for obtaining a high conversion gain described above. The conversion gain of the frequency multiplier 40 is higher than the conversion gain of the frequency multiplier 20 because a magnitude of an effective input voltage is doubled by cross-coupled capacitors. In other words, the frequency multiplier 40 according to an embodiment may use cross-coupled capacitors to increase a magnitude of an effective input voltage, and increase an effective transconductance. In addition, the frequency multiplier 40 may have a high conversion gain, compared to current consumption.

Figure 5A:
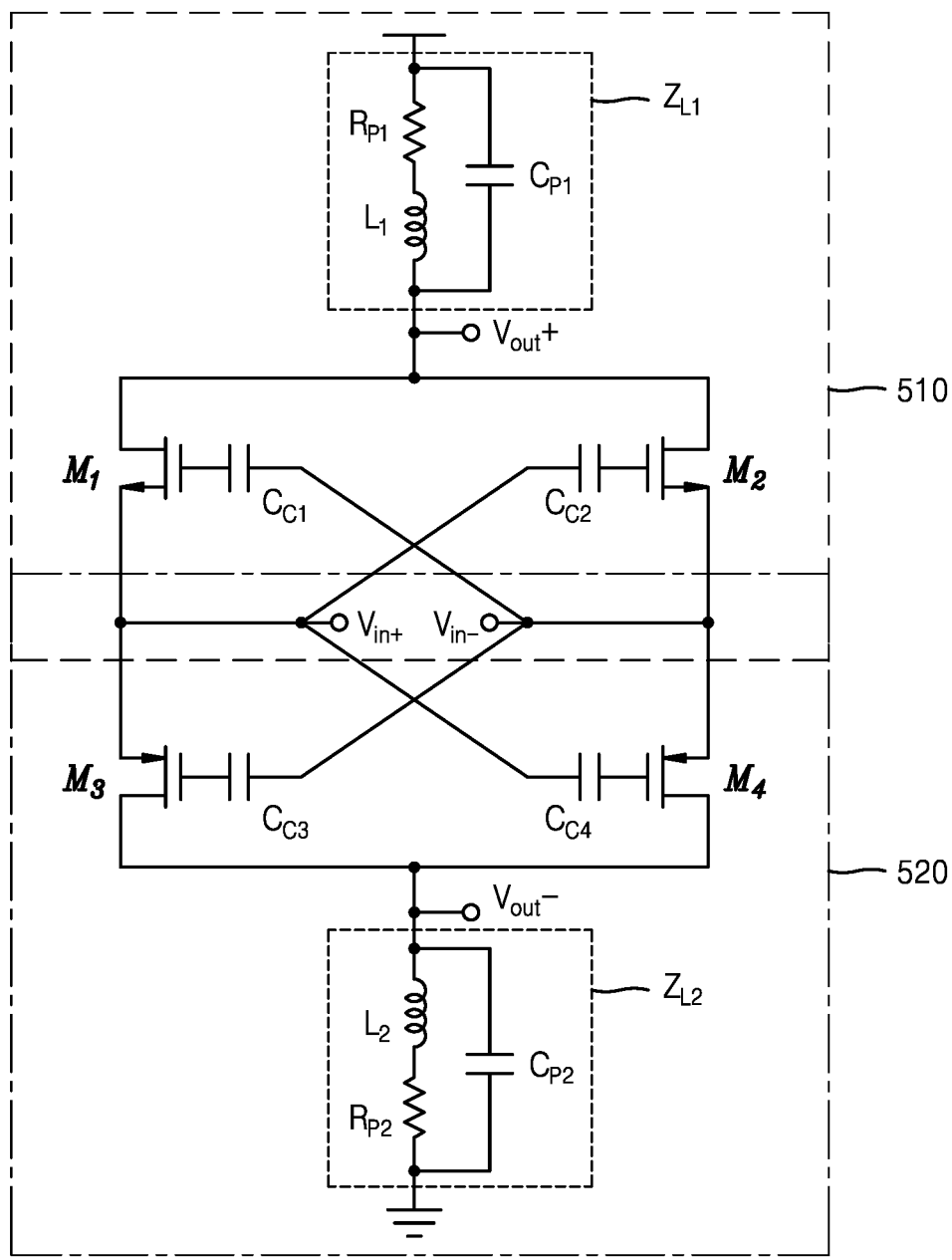
FIG. 5A is a diagram illustrating a circuit of a frequency multiplier, according to an embodiment.

FIG. 5A is a diagram illustrating a circuit of a frequency multiplier, according to an embodiment. Referring to FIG. 5A, a frequency multiplier 50 according to an embodiment may include a first transistor $M_1$, a second transistor $M_2$, a third transistor $M_3$, a fourth transistor $M_4$, a first capacitor $C_{C1}$, a second capacitor $C_{C2}$, a third capacitor $C_{C3}$, a fourth capacitor $C_{C4}$, a first inductor load $Z_{L1}$, and/or a second inductor load $Z_{L2}$.

The first capacitor $C_{C1}$ may be connected between a gate of the first transistor $M_1$ and an inverting input node. The second capacitor $C_{C2}$ may be connected between a gate of the second transistor $M_2$ and a non-inverting input node. The third capacitor $C_{C3}$ may be connected between a gate of the third transistor $M_3$ and the inverting input node. The fourth capacitor $C_{C4}$ may be connected between a gate of the fourth transistor $M_4$ and the non-inverting input node.

A drain of the first transistor $M_1$, a drain of the second transistor $M_2$, and a non-inverting output node may be connected to one another, a drain of the third transistor $M_3$, a drain of the fourth transistor $M_4$, and an inverting output node may be connected to one another, and a source of the first transistor $M_1$ and a source of the third transistor $M_3$ may be connected to each other, and a source of the second transistor $M_2$ and a source of the fourth transistor $M_4$ may be connected to each other. Each of the first transistor $M_1$ and the second transistor $M_2$ may be an NMOS transistor. In addition, each of the third transistor $M_3$ and the fourth transistor $M_4$ may be a PMOS transistor.

The first capacitor $C_{C1}$, the second capacitor $C_{C2}$, the third capacitor $C_{C3}$, and the fourth capacitor $C_{C4}$ may have the same capacitance. In addition, the first transistor $M_1$, the second transistor $M_2$, the third transistor $M_3$, and the fourth transistor $M_4$ may have the same gate-source capacitance. In addition, each of the first capacitor $C_{C1}$, the second capacitor $C_{C2}$, the third capacitor $C_{C3}$, and the fourth capacitor $C_{C4}$ may have a capacitance that is sufficiently greater than a gate-source capacitance of each of the first transistor $M_1$, the second transistor $M_2$, the third transistor $M_3$, and the fourth transistor $M_4$. For example, each of the first capacitor $C_{C1}$, the second capacitor $C_{C2}$, the third capacitor $C_{C3}$, and the fourth capacitor $C_{C4}$ may have a capacitance that is ten (10) times greater than a gate-source capacitance of each of the first transistor $M_1$, the second transistor $M_2$, the third transistor $M_3$, and the fourth transistor $M_4$, but is not limited thereto.

The first inductor load $Z_{L1}$ may be connected to the non-inverting output node, and the second inductor load $Z_{L2}$ may be connected to the inverting output node. Each of the first inductor load $Z_{L1}$ and the second inductor load $Z_{L2}$ may include an inductor, a capacitor, and a resistor, and the capacitor and the resistor may be a parasitic capacitor of the inductor and a parasitic resistor of the inductor, respectively. In detail, the first inductor load $Z_{L1}$ may include a first inductor $L_1$, a first parasitic capacitor $C_{P1}$, and a first parasitic resistor $R_{P1}$. In addition, the second inductor load $Z_{L2}$ may include a second inductor $L_2$, a second parasitic capacitor $C_{P2}$, and a second parasitic resistor $R_{P2}$.

The first inductor load $Z_{L1}$ and the second inductor load $Z_{L2}$ may be circuits for converting a current signal having a multiplied frequency into a voltage signal. Accordingly, a resonant frequency of the first inductor $L_1$ and the first parasitic capacitor $C_{P1}$ of the first inductor load $Z_{L1}$ may be twice a frequency of an input signal. In addition, a resonant frequency of the second inductor $L_2$ and the second parasitic capacitor $C_{P2}$ of the second inductor load $Z_{L2}$ may be twice the frequency of the input signal.

Figure 5B:
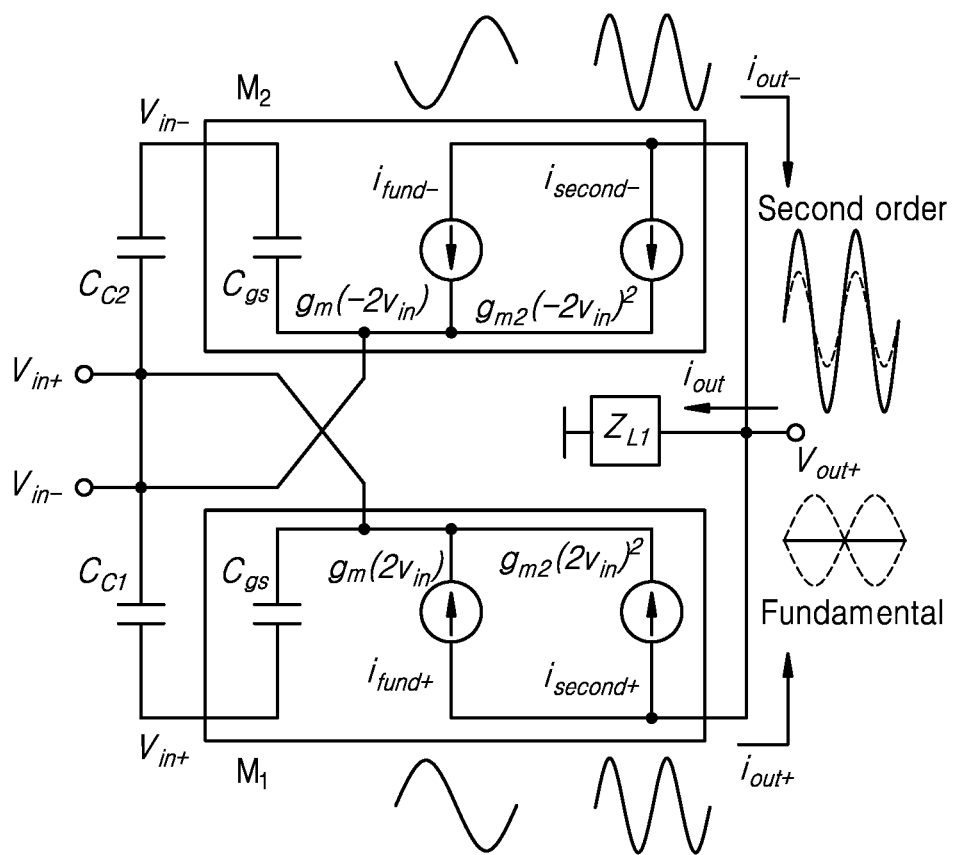
FIG. 5B is a diagram illustrating an equivalent circuit of a portion of a frequency multiplier, according to an embodiment.

FIG. 5B is a diagram illustrating an equivalent circuit of a portion 510 including a first transistor $M_1$ and a second transistor $M_2$ in the frequency multiplier 50 of FIG. 5A. In detail, FIG. 5B may be a small signal equivalent model of the portion 510 of FIG. 5A. Referring to FIG. 5B, the first transistor $M_1$ may be represented by an equivalent circuit including a gate-source capacitor $C_{gs}$ and current sources of the first transistor $M_1$, and the second transistor $M_2$ may be represented by an equivalent circuit including a gate-source capacitor $C_{gs}$ and current sources of the second transistor $M_2$.

Conversion gains of the first transistor $M_1$ and the second transistor $M_2$ may be calculated by the same method as the first transistor $M_1$ and the second transistor $M_2$ of FIG. 3B. Here, an inductor load corresponding to $Z_L$ described with reference to FIG. 3B is a first inductor load $Z_{L1}$. Accordingly, a conversion gain of the frequency multiplier 50 is four times higher than that of the frequency multiplier 20, and the frequency multiplier 50 does not need additional power consumption for obtaining a high conversion gain described above. The conversion gain of the frequency multiplier 50 is higher than the conversion gain of the frequency multiplier 20 because a magnitude of an effective input voltage is doubled by cross-coupled capacitors. In other words, the frequency multiplier 50 according to an embodiment may use cross-coupled capacitors to increase a magnitude of an effective input voltage, and may increase an effective transconductance. In addition, the frequency multiplier 50 may have a high conversion gain, compared to current consumption.

Figure 5C:
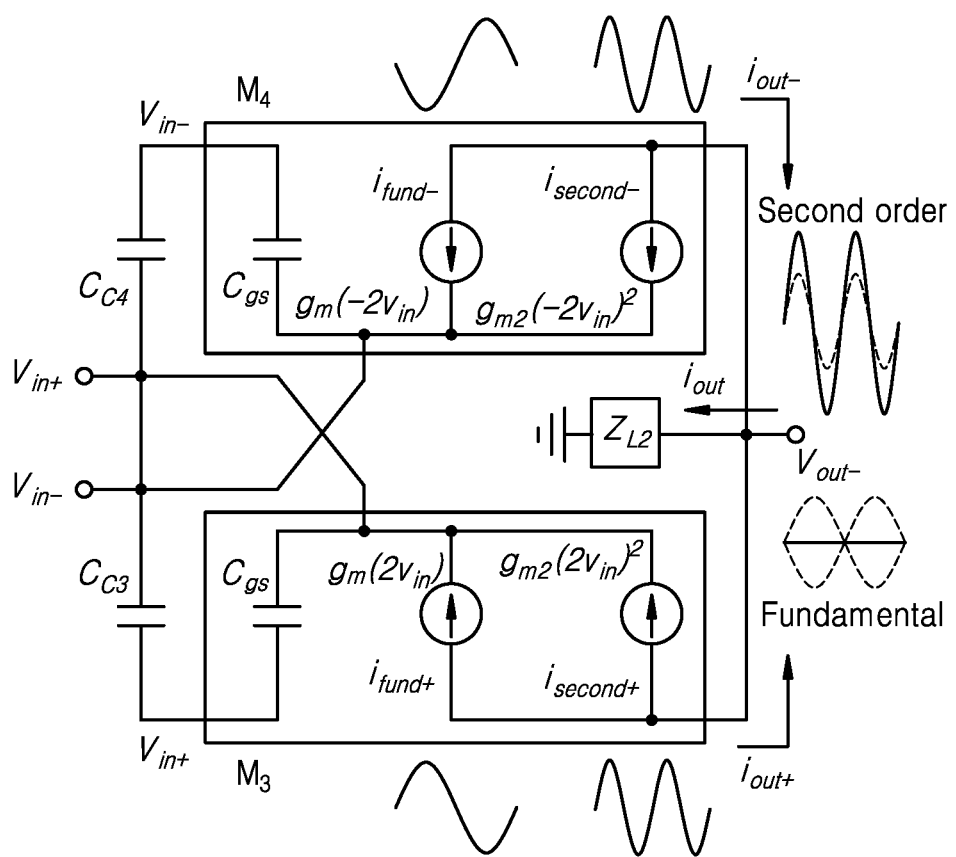
FIG. 5C is a diagram illustrating an equivalent circuit of a portion of a frequency multiplier, according to an embodiment.

FIG. 5C is a diagram illustrating an equivalent circuit of a portion 520 including a third transistor $M_3$ and a fourth transistor $M_4$ in the frequency multiplier 50 of FIG. 5A. In detail, FIG. 5C may be a small signal equivalent model of the portion 520 of FIG. 5A. Referring to FIG. 5C, the third transistor $M_3$ may be represented by an equivalent circuit including a gate-source capacitor $C_{gs}$ and current sources of the third transistor $M_3$, and the fourth transistor $M_4$ may be represented by an equivalent circuit including a gate-source capacitor $C_{gs}$ and current sources of the fourth transistor $M_4$.

Conversion gains of the third transistor $M_3$ and the fourth transistor $M_4$ may be calculated by the same method as the first transistor $M_1$ and the second transistor $M_2$ of FIG. 3B. Here, an inductor load corresponding to $Z_L$ of FIG. 3B is a second inductor load $Z_{L2}$. Accordingly, a conversion gain of the frequency multiplier 50 is four times higher than that of the frequency multiplier 20, and the frequency multiplier 50 does not need additional power consumption for obtaining a high conversion gain described above. The conversion gain of the frequency multiplier 50 is higher than the conversion gain of the frequency multiplier 20 because a magnitude of an effective input voltage is doubled by cross-coupled capacitors. In other words, the frequency multiplier 50 according to an embodiment may use cross-coupled capacitors to increase a magnitude of an effective input voltage, and increase an effective transconductance. In addition, the frequency multiplier 50 may have a high conversion gain, compared to current consumption.

Figure 6:
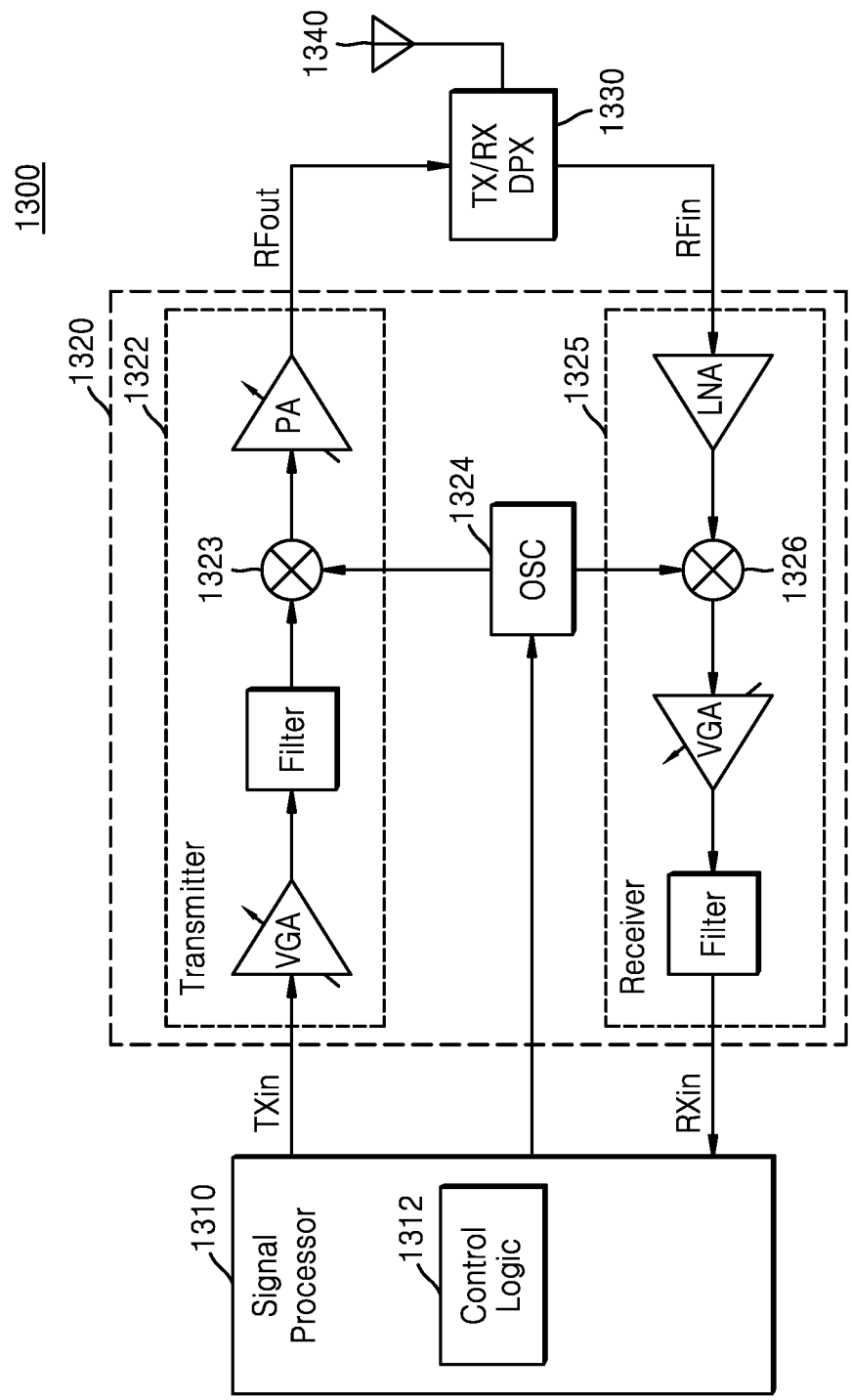
FIG. 6 is a block diagram illustrating a wireless communication device according to an embodiment.

FIG. 6 is a block diagram illustrating a wireless communication device according to an embodiment. A wireless communication device 1300 may include an antenna 1340, and may communicate with a counterpart device by transmitting or receiving a signal thereto or therefrom via the antenna 1340. As a non-limiting example, a wireless communication system in which the wireless communication device 1300 communicates with the counterpart device may be a wireless communication system using a cellular network, such as a 5th generation (5G) wireless system, a long term evolution (LTE) system, an LTE-advanced system, a code division multiple access (CDMA) system, or a global system for mobile communication (GSM) system, a wireless local area network (WLAN) system, or any other wireless communication system.

According to an embodiment, the wireless communication device 1300 may include a signal processor 1310, a transceiver 1320, and a transmission/reception duplexer 1330. The transmission/reception duplexer 1330 may provide the transceiver 1320 with a signal received via the antenna 1340 as an RF input signal RFin, and may provide the antenna 1340 with an RF output signal RFout received from the transceiver 1320. According to an embodiment, the signal processor 1310 may be a baseband processor, and may include a control logic 1312. The signal processor 1310 may process a transmission/reception signal in a baseband, in detail, may generate a baseband signal for a transmission signal path of the transceiver 1320, and may process a baseband signal received via a reception signal path of the transceiver 1320.

The transceiver 1320 may include a transmitter 1322, a receiver 1325, and an oscillator circuit 1324. A frequency multiplier according to an embodiment may be included in the oscillator circuit 1324, or may be used in connection with the oscillator circuit 1324.

The transmitter 1322 may generate the RF output signal RFout by processing a transmission input signal TXin received from the signal processor 1310. As illustrated in FIG. 6, the transmitter 1322 may include a variable gain amplifier (VGA), a TX filter, a TX mixer 1323, and a power amplifier (PA) to process the transmission input signal TXin. The receiver 1325 may generate a reception input signal RXin by processing the RF input signal RFin and provide the generated reception input signal RXin to the signal processor 1310. The receiver 1325 may include a low noise amplifier (LNA), an RX mixer 1326, a VGA, and an RX filter to process the RF input signal RFin. The oscillator circuit 1324 may generate a reference clock signal having a frequency for sampling the transmission input signal TXin and the RF input signal RFin and provide the generated reference clock signal to the TX mixer 1323 and the RX mixer 1326.

Although FIG. 6 illustrates an example in which control information is provided from the signal processor 1310, an embodiment is not limited thereto. For example, the control information may be generated inside the transceiver 1320, or may be generated from another control circuit outside the transceiver 1320.

Figure 7:
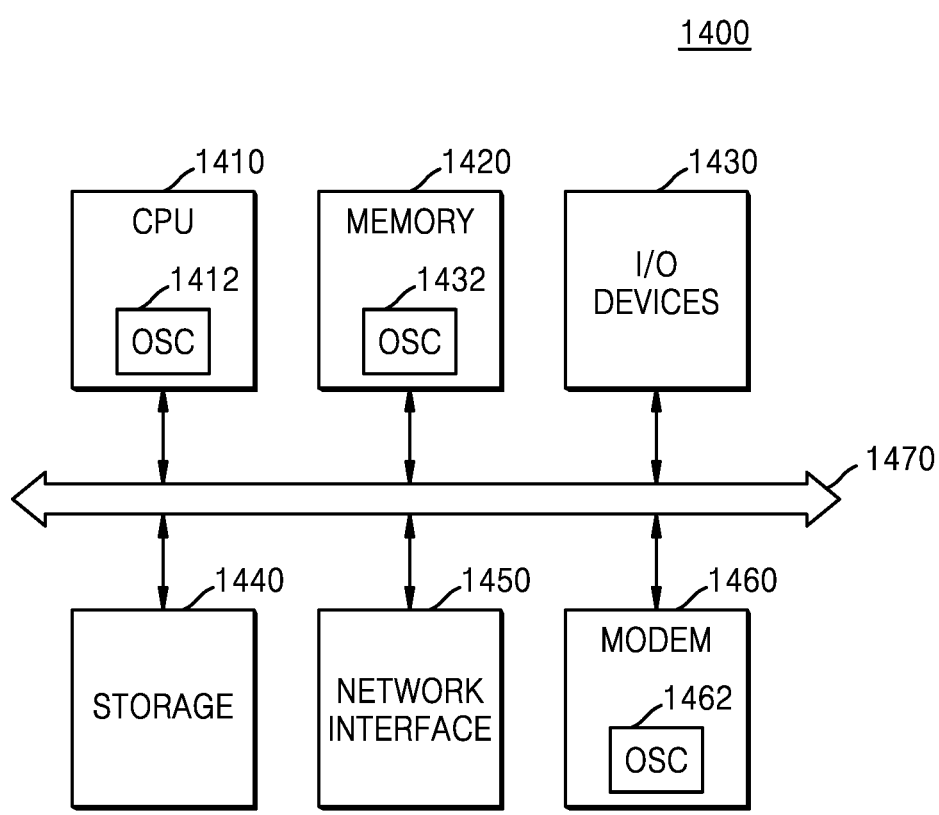
FIG. 7 is a block diagram illustrating a computing system according to an embodiment.

FIG. 7 is a block diagram illustrating a computing system according to an embodiment. A computing system 1400 may be a stationary computing system, such as a desktop computer, a workstation, or a server, or a portable computing system, such as a laptop computer. Also, the computing system 1400 may be a semiconductor device implemented with a semiconductor. As illustrated in FIG. 7, the computing system 1400 may include a central processing unit (CPU) 1410 including an oscillator 1412, a memory 1420, input/output devices 1430, a storage device 1440, and a network interface 1450. The CPU 1410, the memory 1420, the input/output devices 1430, the storage device 1440, the network interface 1450, and a modem 1460 may be connected to a bus 1470 and may communicate with one another through the bus 1470.

The CPU 1410 may be referred to as a processing unit, and may include, for example, at least one core capable of executing a certain instruction set (e.g., Intel Architecture-32 (IA-32), 64-bit expansion IA-32, x86-64, PowerPC, Sparc, MIPS, ARM, IA-64, and the like), such as a micro-processor, an application processor (AP), a digital signal processor (DSP), and a graphics processing unit (GPU). For example, the CPU 1410 may access the memory 1420 through the bus 1470, and may execute instructions stored in random access memory (RAM) or read only memory (ROM). In addition, the CPU 1410 may include the oscillator 1412. The oscillator 1412 may include a frequency multiplier according to an embodiment, or may be used in connection with the frequency multiplier. For example, the oscillator 1412 may generate a clock signal for operating the CPU 1410 needing a clock signal, and may change or multiply a frequency of the clock signal according to a situation. The memory 1420 may include a volatile memory (e.g., RAM), including dynamic RAM (DRAM), or a nonvolatile memory (e.g., ROM), including a flash memory.

In addition, the memory 1420 may include an oscillator 1422. The oscillator 1422 may include a frequency multiplier according to an embodiment, or may be used in connection with the frequency multiplier. For example, the oscillator 1422 may generate a clock signal for operating the CPU 1410 needing a clock signal, and may change or multiply a frequency of the clock signal according to a situation. The input/output devices 1430 may include an input device, such as a keyboard or a pointing device, and may include an output device, such as a display device or a printer. For example, a user may input M and digital trim code K_int or K_frac through the input/output devices 1430, and the input/output devices 1430 may transmit the input M and digital trim code K_int or K_frac to the oscillator 1412 included in the CPU 1410, and the oscillator 1422 included in the memory 1420 through the bus 1470. The oscillator 1412 included in the CPU 1410 and the oscillator 1422 included in the memory 1420 may adjust the frequency of the clock signal according to the received M and digital trim code K_int or K_frac.

The storage device 1440 may store data to be processed by the CPU 1410 or data processed by the CPU 1410. In other words, the CPU 1410 may generate data by processing the data stored in the storage device 1440, and may store the generated data in the storage device 1440. The network interface 1450 may provide access to a network outside the computing system 1400. For example, the network may include a plurality of computing systems and communication links, and the communication links may include wired links, optical links, wireless links, or any other types of links. The modem 1460 may perform wireless communication or wired communication with an external device. For example, the modem 1460 may perform ethernet communication, near field communication (NFC), radio Frequency Identification (RFID) communication, mobile telecommunication, memory card communication, universal serial bus (USB) communication, and the like, but is not limited thereto. In addition, the modem 1460 may include an oscillator 1462. For example, the oscillator 1462 may generate a clock signal for operating the modem 1460 needing a clock signal, and may change or multiply a frequency of the clock signal according to a situation. The oscillator 1462 may include a frequency multiplier according to an embodiment, or may be used in connection with the frequency multiplier.

According to an embodiment, the oscillators 1412, 1422, and 1462 may be constituted as externally independent devices, and may further include clock control units configured to control frequencies of clock signals of the computing system 1400. Accordingly, different clock signals may be provided to the CPU 1410, the memory 1420, and the modem 1460 that operate at different operation frequencies.

Embodiments have been illustrated in the drawings and description as described above. Although the embodiments have been described herein by using certain terms, these are used only for the purpose of describing the spirit of the inventive concept and not used to limit the meaning or the scope of the inventive concept defined by claims. While the inventive concept has been particularly shown and described with reference to embodiments thereof, it will be understood that various changes in form and details may be made therein without departing from the spirit and scope of the following claims.

What is claimed is:

1. A frequency multiplier, comprising:
    a first transistor having a drain electrically coupled to a non-inverting output node of the frequency multiplier;
    a second transistor having a drain electrically coupled to the drain of the first transistor and to the non-inverting output node;
    a third transistor having a drain electrically coupled to an inverting output node of the frequency multiplier, and a source electrically coupled to a source of the first transistor;
    a fourth transistor having a drain electrically coupled to the drain of the third transistor and to the inverting output node, and a source electrically coupled to a source of the second transistor;
    a first capacitor having first and second terminals electrically coupled to a gate of the first transistor and an inverting input node of the frequency multiplier, respectively;
    a second capacitor having first and second terminals electrically coupled to a gate of the second transistor and a non-inverting input node of the frequency multiplier, respectively;
    a third capacitor having first and second terminals electrically coupled to a gate of the third transistor and the inverting input node, respectively;
    a fourth capacitor having first and second terminals electrically coupled to a gate of the fourth transistor and the non-inverting input node, respectively;
    a fifth capacitor having a first terminal electrically coupled to a first node, which electrically connects the source of the first transistor and the source of the third transistor together, and a second terminal electrically coupled to the non-inverting input node; and
    a sixth capacitor having a first terminal electrically coupled to a second node, which electrically connects the source of the second transistor and the source of the fourth transistor together, and a second terminal electrically coupled to the inverting input node.

2. The frequency multiplier of claim 1, wherein each of the first transistor and the second transistor includes an N-channel metal-oxide semiconductor (NMOS) transistor, and each of the third transistor and the fourth transistor includes a P-channel metal-oxide semiconductor (PMOS) transistor.

3. The frequency multiplier of claim 1, wherein the first, second, third and fourth capacitors have a same capacitance.

4. The frequency multiplier of claim 3, wherein the first transistor, the second transistor, the third transistor, and the fourth transistor are configured to have equivalent gate-source capacitances; and wherein the first capacitor has a capacitance that is at least ten times greater the gate-source capacitance of the first transistor.

5. The frequency multiplier of claim 1, wherein the fifth capacitor and the sixth capacitor have a same capacitance; and wherein the fifth capacitor has a capacitance that is about twice a capacitance of the first capacitor.

6. The frequency multiplier of claim 1, further comprising first and second inductor loads electrically coupled to the non-inverting and inverting output nodes, respectively.

7. The frequency multiplier of claim 6, wherein the first inductor load includes a first inductor, a first parasitic capacitor, and a first parasitic resistor; and wherein the second inductor load includes a second inductor, a second parasitic capacitor, and a second parasitic resistor.

8. The frequency multiplier of claim 7, wherein each of the first inductor load and the second inductor load is configured to have a resonant frequency that is about twice a frequency of an input signal applied to the non-inverting and inverting input nodes.

9. A frequency multiplier, comprising:
    a capacitor circuit having a plurality of capacitors therein, and responsive to a differential input signal; and
    a frequency multiplication circuit (FMC) having first, second, third and fourth transistors therein, said FMC configured to multiply a frequency of a signal received from the capacitor circuit;
    wherein at least some of the plurality of capacitors have terminals electrically connected to gates of the first, second, third and fourth transistors; and
    wherein the capacitor circuit includes capacitors having terminals connected to sources of the first, second, third and fourth transistors.

10. The frequency multiplier of claim 9, wherein the gates and sources of the first, second, third and fourth transistors are configured to receive components of the differential input signal through the plurality of capacitors.

11. The frequency multiplier of claim 9, wherein capacitors having terminals electrically connected to the gates of the first, second, third and fourth transistors have a capacitance that is at least ten (10) times a gate-source capacitance of the first, second, third and fourth transistors.

12. The frequency multiplier of claim 9, wherein the capacitors connected to the sources of the first, second, third and fourth transistors have a capacitance that is at least twenty (20) times the gate-source capacitances of the first, second, third and fourth transistors.

13. The frequency multiplier of claim 9, further comprising:
    an inductor load configured to convert a current signal having a multiplied frequency relative to a frequency of the differential input signal, into a voltage signal.

14. The frequency multiplier of claim 13, wherein the inductor load includes an inductor, a parasitic capacitor, and a parasitic resistor.

15. The frequency multiplier of claim 14, wherein the inductor load has a resonant frequency that is twice a frequency of the differential input signal.

16. A frequency multiplier, comprising:
    a first totem pole arrangement of a first NMOS transistor and a first PMOS transistor having source terminals electrically connected together at a first source node;

a second totem pole arrangement of a second NMOS transistor and a second PMOS transistor having source terminals electrically connected together at a second source node;

a first input terminal capacitively coupled to the first source node;

a second input terminal capacitively coupled to the second source node;

a first load having a net inductive reactance, electrically connected to drain terminals of the first and second NMOS transistors;

a second load having a net inductive reactance, electrically connected to drain terminals of the first and second PMOS transistors;

a first capacitor having a first terminal electrically connected to the first source node and a second terminal electrically connected to the first input terminal; and a second capacitor having a first terminal electrically connected to the second source node and a second terminal electrically connected to the second input terminal; and wherein each of the first NMOS transistor and the first PMOS transistor has a respective gate terminal electrically connected to the second terminal of the second capacitor and each of the second NMOS transistor and the second PMOS transistor has a respective gate terminal electrically connected to the second terminal of the first capacitor.

17. The frequency multiplier of claim 16, wherein the first and second input terminals of the frequency multiplier are responsive to true and complementary signals of a differential input signal.

18. The frequency multiplier of claim 17, further comprising:

a third capacitor having a first terminal electrically coupled to the second input terminal and a second terminal electrically connected to the gate terminal of the first NMOS transistor;

a fourth capacitor having a first terminal electrically coupled to the first input terminal and a second terminal electrically connected to the gate terminal of the second NMOS transistor;

a fifth capacitor having a first terminal electrically coupled to the second input terminal and a second terminal electrically connected to the gate terminal of the first PMOS transistor; and a sixth capacitor having a first terminal electrically coupled to the first input terminal and a second terminal electrically connected to the gate terminal of the second PMOS transistor.

* * * * *